United States Patent
Watanabe

(10) Patent No.: US 8,643,412 B2
(45) Date of Patent: Feb. 4, 2014

(54) TEST APPARATUS, TRANSMISSION APPARATUS, RECEIVING APPARATUS, TEST METHOD, TRANSMISSION METHOD AND RECEIVING METHOD

(75) Inventor: Daisuke Watanabe, Saitama (JP)

(73) Assignee: Advantest Corporation, Tokyo (JP)

( * ) Notice: Subject to any disclaimer, the term of this patent is extended or adjusted under 35 U.S.C. 154(b) by 82 days.

(21) Appl. No.: 13/026,155

(22) Filed: Feb. 11, 2011

(65) Prior Publication Data

US 2011/0199134 A1 Aug. 18, 2011

Related U.S. Application Data

(63) Continuation of application No. PCT/JP2008/066005, filed on Sep. 4, 2008.

(51) Int. Cl.
*H03L 7/00* (2006.01)
(52) U.S. Cl.
USPC .......................................... 327/144; 327/141
(58) Field of Classification Search
USPC .......................... 327/141, 147–150, 156–159
See application file for complete search history.

(56) References Cited

U.S. PATENT DOCUMENTS

| 4,253,191 A | 2/1981 | Oguchi |
| 6,320,436 B1 * | 11/2001 | Fawcett et al. ............... 327/158 |
| 2005/0047495 A1 | 3/2005 | Yoshioka |
| 2007/0006031 A1 | 1/2007 | Kantake |
| 2008/0018345 A1 | 1/2008 | Chiba et al. |

FOREIGN PATENT DOCUMENTS

| JP | 58-1574 B2 | 1/1983 |
| JP | 61-121547 A | 6/1986 |
| JP | 1-241247 A | 9/1989 |
| JP | 6-27217 A | 2/1994 |
| JP | 2005-77274 A | 3/2005 |
| JP | 2005-285160 A | 10/2005 |
| JP | 2008-28628 A | 2/2008 |
| KR | 10-2007-0023570 A | 2/2007 |

OTHER PUBLICATIONS

International Search Report (ISR) issued in PCT/JP2008/066005 (parent application) mailed in Dec. 2008 for Examiner consideration.
Written Opinion (PCT/ISA/237) issued in PCT/JP2008/066005 (parent application) mailed in Dec. 2008.
Korean Office Action dated Apr. 27, 2012, in a counterpart Korean patent application No. 10-2011-7003700.
JP Office Action and English Translation Dated Nov. 13, 2012; Application No. 2010-527626.

* cited by examiner

*Primary Examiner* — Lincoln Donovan
*Assistant Examiner* — Diana J Cheng

(57) ABSTRACT

Provided is a test apparatus that tests a device under test, comprising a phase comparing section that compares a phase of an internal clock generated in the test apparatus and a phase of a clock superimposed on a device signal output by the device under test; an adjusting section that adjusts a phase shift amount of the internal clock with respect to the device signal, based on the phase comparison result; an acquiring section that acquires the device signal according to the internal clock whose phase shift amount with respect to the device signal is adjusted; and an inhibiting section that inhibits change of the phase shift amount based on the phase comparison result, for at least a portion of a period during which the clock is not superimposed on the device signal. Also provided is a test method relating to the test apparatus.

20 Claims, 9 Drawing Sheets

TEST APPARATUS, TRANSMISSION APPARATUS, RECEIVING APPARATUS, TEST METHOD, TRANSMISSION METHOD AND RECEIVING METHOD

BACKGROUND

1. Technical Field

The present invention relates to a test apparatus, a transmission apparatus, a receiving apparatus, a test method, a transmission method, and a receiving method.

2. Related Art

Patent Document 1 discloses a test apparatus that tests a device under test outputting a signal with a clock embedded therein. The test apparatus includes a CDR (Clock Data Recovery) circuit. The CDR circuit contains a PLL circuit that outputs a recovered clock having a frequency that is a prescribed multiple of the frequency of a reference clock supplied thereto and a phase obtained by delaying the phase of the reference clock by a delay amount supplied thereto, and also a phase comparator that detects the phase difference between the recovered clock and the clock embedded in a data signal from the device under test. The CDR circuit controls the delay amount supplied to the PLL circuit according to the phase difference. The test apparatus acquires the output signal according to the recovered clock. For example, see paragraphs 0017, 0023, and 0024 of Patent Document 1.

Patent Document 1: Japanese Patent Application Publication No. 2008-28628

A phase comparator that compares the phase of a recovered clock to the phase of a data signal from a device usually outputs information indicating that the state of the recovered clock is earlier or later than the data signal from the device under test. When the device under test outputs a burst signal that remains unchanged for a long period, such a phase comparator outputs information indicating either the early state or the late state over a long period. In this case, while the device under test is outputting the burst signal, the phase of the recovered clock is delayed or advanced in only one direction, and therefore the recovered clock exits a phase-locked state with respect to the device under test.

In this state, when the device under test again outputs the data signal and testing is resumed, the recovered clock is not locked with respect to the data signal, and therefore the test apparatus cannot correctly acquire the data signal. As a result, the test apparatus must wait until the recovered clock is locked with respect to the data signal, which causes an increase in the overall testing time. This problem occurs when a signal with a clock embedded therein is supplied from the test apparatus to the device under test, and also when a signal with a clock embedded therein is exchanged between two or more apparatuses, which are not limited to test apparatuses.

SUMMARY

Therefore, it is an object of an aspect of the innovations herein to provide a test apparatus, a transmission apparatus, a receiving apparatus, a test method, a transmission method, and a receiving method, which are capable of overcoming the above drawbacks accompanying the related art. The above and other objects can be achieved by combinations described in the independent claims.

According to a first aspect related to the innovations herein, provided is a test apparatus that tests a device under test, comprising a phase comparing section that compares a phase of an internal clock generated in the test apparatus and a phase of a clock superimposed on a device signal output by the device under test; an adjusting section that adjusts a phase shift amount of the internal clock with respect to the device signal, based on the phase comparison result; an acquiring section that acquires the device signal according to the internal clock whose phase shift amount with respect to the device signal is adjusted; and an inhibiting section that inhibits change of the phase shift amount based on the phase comparison result, for at least a portion of a period during which the clock is not superimposed on the device signal. Also provided is a test method relating to the test apparatus.

According to a second aspect related to the innovations herein, provided is a test apparatus that tests a device under test. The device under test includes a phase comparing section that compares a phase of an internal clock of the device under test and a phase of a clock superimposed on a reception signal input via an input terminal; an adjusting section that adjusts a phase shift amount of the internal clock with respect to the reception signal, based on the phase comparison result; and an acquiring section that acquires the reception signal according to the internal clock whose phase shift amount with respect to the reception signal is adjusted. The test apparatus comprises a test signal supplying section that supplies a test signal for testing the device under test to the input terminal of the device under test; and an inhibiting section that supplies the device under test with an inhibition signal inhibiting change of the phase shift amount based on the phase comparison result, for at least a portion of a period during which the clock is not superimposed on the test signal. Also provided is a test method relating to the test apparatus.

According to a third aspect related to the innovations herein, provided is a receiving apparatus comprising a phase comparing section that compares a phase of a reference clock to a phase of a clock superimposed on a reception signal from the outside; an adjusting section that adjusts a phase shift amount of the reference clock with respect to the reception signal, based on the phase comparison result; an acquiring section that acquires the reception signal according to the reference clock whose phase shift amount with respect to the reception signal is adjusted; and an inhibiting section that inhibits change of the phase shift amount based on the phase comparison result, for at least a portion of a period during which the clock is not superimposed on the reception signal. Also provided is a receiving method relating to the receiving apparatus.

According to a fourth aspect related to the innovations herein, provided is a transmission apparatus that transmits a signal to a receiving apparatus. The receiving apparatus includes a phase comparing section that compares a phase of a reference clock of the receiving apparatus and a phase of a clock superimposed on a reception signal input via an input terminal; an adjusting section that adjusts a phase shift amount of the reference clock with respect to the reception signal, based on the phase comparison result; and an acquiring section that acquires the reception signal according to the reference clock whose phase shift amount with respect to the reception signal is adjusted. The transmission apparatus comprises a transmitting section that supplies, to the input terminal of the receiving apparatus, a transmission signal to be transmitted to the receiving apparatus; and an inhibiting section that inhibits change of the phase shift amount based on the phase comparison result, for at least a portion of a period during which the clock is not superimposed on the transmission signal.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
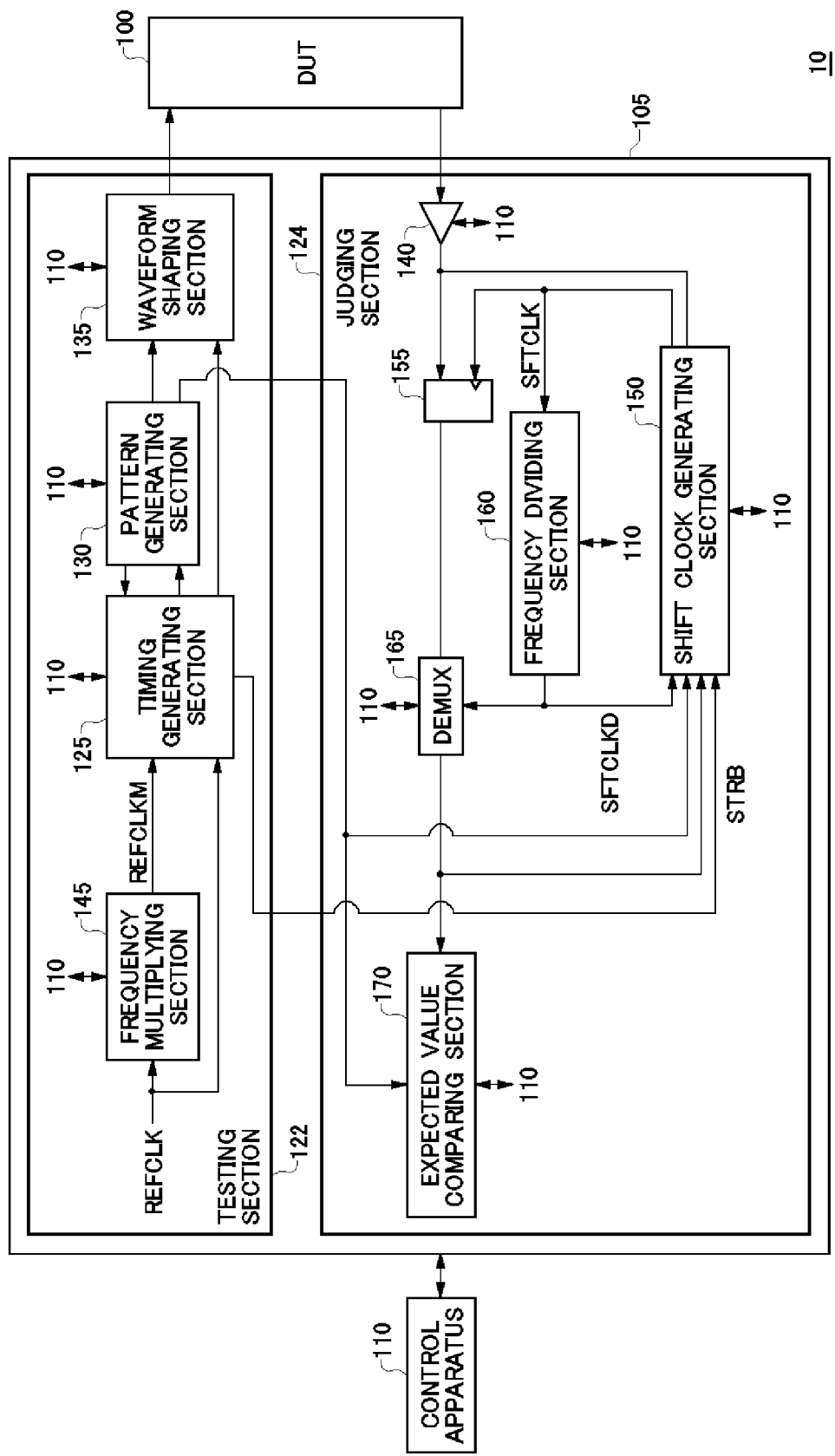
FIG. 1 shows a configuration of a test apparatus 10 according to an embodiment of the present invention.

FIG. 1 shows a configuration of a test apparatus 10 according to an embodiment of the present invention, along with a DUT (Device Under Test) 100. When testing a DUT 100 that outputs a device signal with a clock superimposed thereon, the test apparatus 10 phase locks an internal clock generated in the test apparatus 10 with respect to the clock extracted from the device signal. The test apparatus 10 prevents changing of the phase of the internal clock during a period when the clock is not superimposed on the device signal. As a result, while a burst signal is being received as the device signal, the test apparatus 10 can maintain the phase of the internal clock in the immediately prior locked state. Accordingly, when the data signal is again output from the DUT 100, the test apparatus 10 can receive the data signal using the phase of the internal clock in the immediately prior locked state.

The test apparatus 10 includes a test apparatus body 105 that tests the DUT 100 and a control apparatus 110 that controls testing of the DUT 100 by the test apparatus body 105. The test apparatus body 105 includes a testing section 122 that executes a test sequence for testing the DUT 100 and supplies the DUT 100 with a test signal generated according to the test sequence, and a judging section 124 that receives and analyzes the device signal output by the DUT 100 in response to the test signal to judge pass/fail of the DUT 100.

The testing section 122 includes a frequency multiplying section 145, a timing generating section 125, a pattern generating section 130, and a waveform shaping section 135. The frequency multiplying section 145 multiplies a reference clock REFCLK of the test apparatus 10 by an integer, and outputs the result as a multiplied clock REFCLKM. The frequency multiplying section 145 may output the multiplied clock REFCLKM with a frequency converted to be the same as the frequency of the device signal output by the DUT 100, or may instead output the multiplied clock REFCLKM with a different frequency than the device signal and use the timing generating section 125 to convert the frequency of the multiplied clock REFCLKM to be the same as the frequency of the device signal. Here, the clock REFCLK may be a system clock for operating the overall test apparatus body 105, or may be a reference clock used to exchange signals with the DUT 100. Furthermore, depending on the relationship between the frequency of the reference clock REFCLK and the frequency of the clock superimposed on the device signal, a configuration may be adopted that does not include the frequency multiplying section 145 or that uses a frequency divider instead of the frequency multiplying section 145.

The timing generating section 125 receives the reference clock REFCLK and the multiplied clock REFCLKM generated by the frequency multiplying section 145, and generates a periodic signal, also referred to as a RATE signal, indicating a test frequency for testing the DUT 100 and a timing signal designating the change timing of the test signal supplied to the DUT 100. The timing generating section 125 changes the frequency and/or phase of the reference clock REFCLK and/or the multiplied clock REFCLKM to generate a strobe signal STRB adjusted to have substantially the same frequency as the device signal, and this strobe signal STRB is a clock that serves as the basis of a shift clock SFTCLK used by the judging section 124 for acquiring the device signal. The strobe signal STRB is an example of an internal clock generated in the test apparatus 10. As an example, the timing generating section 125 may generate the strobe signal STRB by thinning the clock pulses of the multiplied clock REFCLKM to adjust the intervals between clock pulses to be uniform, such that the frequency of the generated strobe signal STRB becomes the same as the frequency of the device signal. The timing generating section 125 may frequency divide at least one of (i) the reference clock REFCLK or the multiplied clock REFCLKM and (ii) the strobe signal STRB oscillated by a VCO (Voltage-Controlled Oscillator) to have the same frequency as each other, and then perform phase adjustment by controlling the oscillation frequency of the VCO such that the clock based on the strobe signal STRB is phase locked with respect to the clock based on the reference clock REFCLK or the multiplied clock REFCLKM.

For each test period according to the periodic signal received from the timing generating section 125, the pattern generating section 130 executes the test commands in the test sequence based on the test program supplied from the control apparatus 110, and outputs a test pattern associated with each of the test commands to the waveform shaping section 135. The pattern generating section 130 outputs, to the expected value comparing section 170, an expected value pattern associated with each of the test commands. The waveform shaping section 135 generates the test signal by shaping the waveform of the test pattern received from the pattern generating section 130 such that the waveform changes at a timing according to the timing signal received from the timing generating section 125. The waveform shaping section 135 supplies the DUT 100 with the generated test signal.

The testing section 122 that supplies the test signal to the DUT 100 may adopt any of a variety of configurations instead of the configuration described above. For example, instead of being a sequential pattern generator that generates the test pattern based on the test program, the pattern generating section 130 may be an algorithmic pattern generator that generates the test pattern based on an algorithm set prior to testing. In order to output the device signal, which is the signal under test, from the DUT 100, the testing section 122 may supply the DUT 100 with a test signal that is identical to a signal used during actual operation, or may set a scan path or the like for testing the DUT 100, in order to cause the DUT to output the device signal, which is the signal under test. The testing section 122 may supply a digital or analog test signal, according to the type of DUT 100.

The judging section 124 includes a comparator 140, a shift clock generating section 150, an acquiring section 155, a frequency dividing section 160, a DEMUX (demultiplexer) 165, and an expected value comparing section 170. The comparator 140 receives the device signal output by the DUT 100, and converts the device signal into a signal waveform used within the judging section 124. In the present embodiment, the comparator 140 compares the device signal to a threshold voltage corresponding to a logic value, and outputs a logic value corresponding to the comparison result.

The shift clock generating section 150 adjusts the phase of the strobe signal STRB generated by the control apparatus 110, according to the device signal received via the comparator 140, to generate the shift clock SFTCLK, which is an internal clock whose phase shift amount with respect to the device signal is adjusted. The shift clock generating section 150 outputs the generated shift clock SFTCLK to the acquiring section 155 and the frequency dividing section 160. The shift clock generating section 150 determines whether phase adjustment is allowed, according to instructions from the control apparatus 110 and the pattern generating section 130 or to measurement results of the device signal received from the DEMUX 165.

The acquiring section 155 is a flip-flop, for example, and acquires the device signal according to the shift clock SFTCLK. The frequency dividing section 160 frequency divides the shift clock SFTCLK and supplies the divided shift clock SFTCLKD to the shift clock generating section 150 and the DEMUX 165.

The DEMUX 165 demultiplexes the device signal acquired from the acquiring section 155, according to the divided shift clock SFTCLKD, and outputs the demultiplexed device signal to the shift clock generating section 150 and the expected value comparing section 170. The frequency dividing section 160 may frequency divide the shift clock SFTCLK to output a divided shift clock SFTCLKD with the same frequency as the periodic signal RATE or the reference clock REFCLK. The DEMUX 165 parallelizes the device signal sequentially acquired in synchronization with the shift clock SFTCLK by the acquiring section 155, and converts the device signal into a device signal having a plurality of bits in synchronization with the divided shift clock SFTCLKD. For example, if the division ratio is 1:8, the DEMUX 165 allocates each continuous 8-bits of the device signal sequentially acquired by the acquiring section 155 respectively to bits of data in an 8-bit wide signal, thereby converting the device signal into an 8-bit device signal with ⅛ of the original frequency.

The expected value comparing section 170 receives the demultiplexed device signal from the DEMUX 165 and compares the demultiplexed device signal to corresponding expected values in the expected value pattern supplied from the pattern generating section 130. As a result, the expected value comparing section 170 can compare the values of the device signal output from the DUT 100 and acquired by the acquiring section 155 to the expected values. The expected value comparing section 170 may store the comparison results between the value of the device signal and the expected value in a storage apparatus such as a fail memory or register. The control apparatus 110 can detect whether a fail has occurred by accessing the storage device during or after testing, and can notify a user of the test apparatus 10 concerning whether a fail has occurred. The test apparatus 10 may change the executed test sequence according to whether a fail has occurred.

The control apparatus 110 controls each component of the test apparatus body 105. The control apparatus 110 accesses registers or memories provided for the frequency multiplying section 145, the timing generating section 125, the pattern generating section 130, the waveform shaping section 135, the comparator 140, the shift clock generating section 150, the DEMUX 165, the expected value comparing section 170, and the like in the test apparatus body 105, and sets the function and operation of each component. For example, the control apparatus 110 may set a multiplication rate in the frequency multiplying section 145 used when multiplying the reference clock REFCLK to obtain the multiplied reference clock REFCLKM, set a frequency ratio between the multiplied reference clock REFCLKM and the strobe signal STRB in the timing generating section 125, or set whether phase adjustment is allowed in the shift clock generating section 150. As other examples, the control apparatus 110 may set a division ratio of the divided shift clock SFTCLKD with respect to the shift clock SFTCLK in the frequency dividing section 160, and set which bits of the device signal received from the acquiring section 155 are to be demultiplexed in the DEMUX 165.

Figure 2:
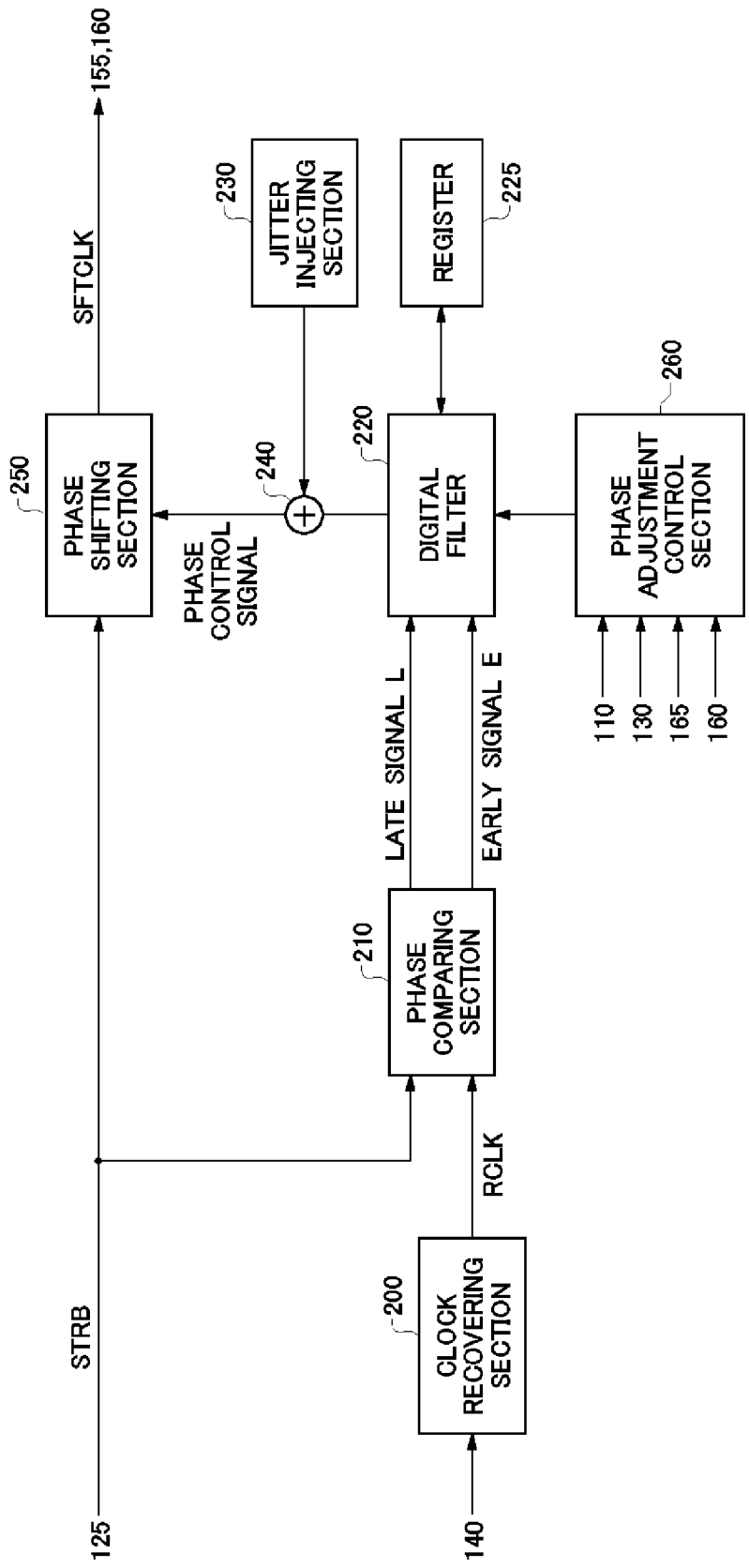
FIG. 2 shows a configuration of the shift clock generating section 150 according to the present embodiment.

FIG. 2 shows a configuration of the shift clock generating section 150 according to the present embodiment. The shift clock generating section 150 includes a clock recovering section 200, a phase comparing section 210, a digital filter 220, a register 225, a jitter injecting section 230, an adder 240, a phase shifting section 250, and a phase adjustment control section 260.

The clock recovering section 200 recovers the clock of the device signal from the device signal output from the DUT 100. More specifically, the clock recovering section 200 outputs a recovered clock RCLK having edges corresponding to an edge timing at which the logic value of the device signal changes. For example, the clock recovering section 200 may recover the recovered clock RCLK with the same edges as the device signal and a pulse width of a prescribed time, by calculating the exclusive OR or the exclusive NOR of the device signal and a delayed device signal obtained by delaying the device signal by a prescribed time.

The phase comparing section 210 compares the phase of the strobe signal STRB to the phase of the recovered clock RCLK obtained by extracting the clock superimposed on the device signal. The phase comparing section 210 outputs, as a phase comparison result, a late signal L indicating that the edge of the strobe signal STRB is behind the edge of the recovered clock RCLK obtained by extracting the clock superimposed on the device signal or an early signal E indicating that the edge of the strobe signal STRB is ahead of the edge of the recovered clock RCLK.

The phase comparing section 210 may be a PFD (Phase Frequency Detector) or a PD (Phase Detector). The early signal E and the late signal L may be pulse-width-modulated digital signals whose pulse widths correspond to the advancement or delay, or may be 1-bit signals that have logic values corresponding to an advancement or a delay.

The digital filter 220, the register 225, the jitter injecting section 230, the adder 240, and the phase shifting section 250 function as an adjusting section that adjusts the phase shift amount of the strobe signal STRB relative to the device signal, based on the phase comparison result of the phase comparing section 210. The digital filter 220 controls the phase shift amount of the phase shifting section 250 by supplying the phase shifting section 250 with the phase control signal for controlling the phase shifting section 250, according to the early signal E and the late signal L sequentially input thereto. More specifically, on a condition that change of the phase shift amount is not inhibited by the phase adjustment control section 260, the digital filter 220 increases the phase shift amount when the early signal E is received as the phase comparison result and decreases the phase shift amount when the late signal L is received as the phase comparison result. Furthermore, on a condition that change of the phase shift amount is inhibited by the phase adjustment control section 260, the digital filter 220 does not change the phase shift amount of the adjusting section.

The digital filter 220 may integrate the early signal E and the late signal L, and output the integrated values as the phase control signal. For example, the digital filter 220 may include a counter that, when a change in the phase shift amount is not inhibited, counts up in a cycle where the early signal E is received and counts down in a cycle where the late signal L is received. The digital filter 220 may then output a phase control signal based on the count value, e.g. a phase control signal containing a prescribed number of bits from the most significant bit of the count value. Instead, the digital filter 220 may be an infinite impulse response filter (IIR filter) or a finite impulse response filter (FIR filter).

The register 225 is a saving destination for saving the phase shift amounts of the strobe signal STRB designated by the digital filter 220. For example, the register 225 receives the count values of the counter in the digital filter 220 from the digital filter 220 and stores the count values, according to instructions from the phase adjustment control section 260 to the digital filter 220. The digital filter 220 can restore the saved phase shift amount by setting the count value saved in the register 225 for the counter of the digital filter 220.

When performing a jitter tolerance test on the device signal output by the DUT 100, the jitter injecting section 230 generates a jitter signal to be superimposed on the shift clock SFTCLK and adds this jitter signal to the phase control signal output by the digital filter 220, via the adder 240. As a result, the jitter injecting section 230 and the adder 240 change the value of the phase control signal output by the digital filter 220 according to the value of the jitter signal to be superimposed, and supply the resulting phase control signal to the phase shifting section 250.

The phase shifting section 250 is a variable delay circuit, for example, that receives the phase control signal, to which jitter may be added as needed, from the adder 240 and delays the strobe signal STRB by a delay amount corresponding to the phase control signal. As a result, the phase shifting section 250 shifts the phase of the strobe signal STRB, with respect to the device signal, by the phase shift amount designated by the phase control signal, and outputs the result as the shift clock SFTCLK. As described above, when the strobe signal STRB is ahead of the recovered clock RCLK, the digital filter 220 increases the phase shift amount, so that the phase shifting section 250 delays the phase of the shift clock SFTCLK to match the phases of the strobe signal STRB and the recovered clock RCLK. When the strobe signal STRB is behind the recovered clock RCLK, the digital filter 220 decreases the phase shift amount, so that the phase shifting section 250 advances the phase of the shift clock SFTCLK to match the phases of the strobe signal STRB and the recovered clock RCLK.

The phase adjustment control section 260 controls whether the change of the phase shift amount of the digital filter 220 is allowed or inhibited. The phase adjustment control section 260 functions as an inhibiting section that inhibits change of the phase shift amount based on the phase comparison result, during at least a portion of a period in which the clock is not superimposed on the device signal.

Figure 3:
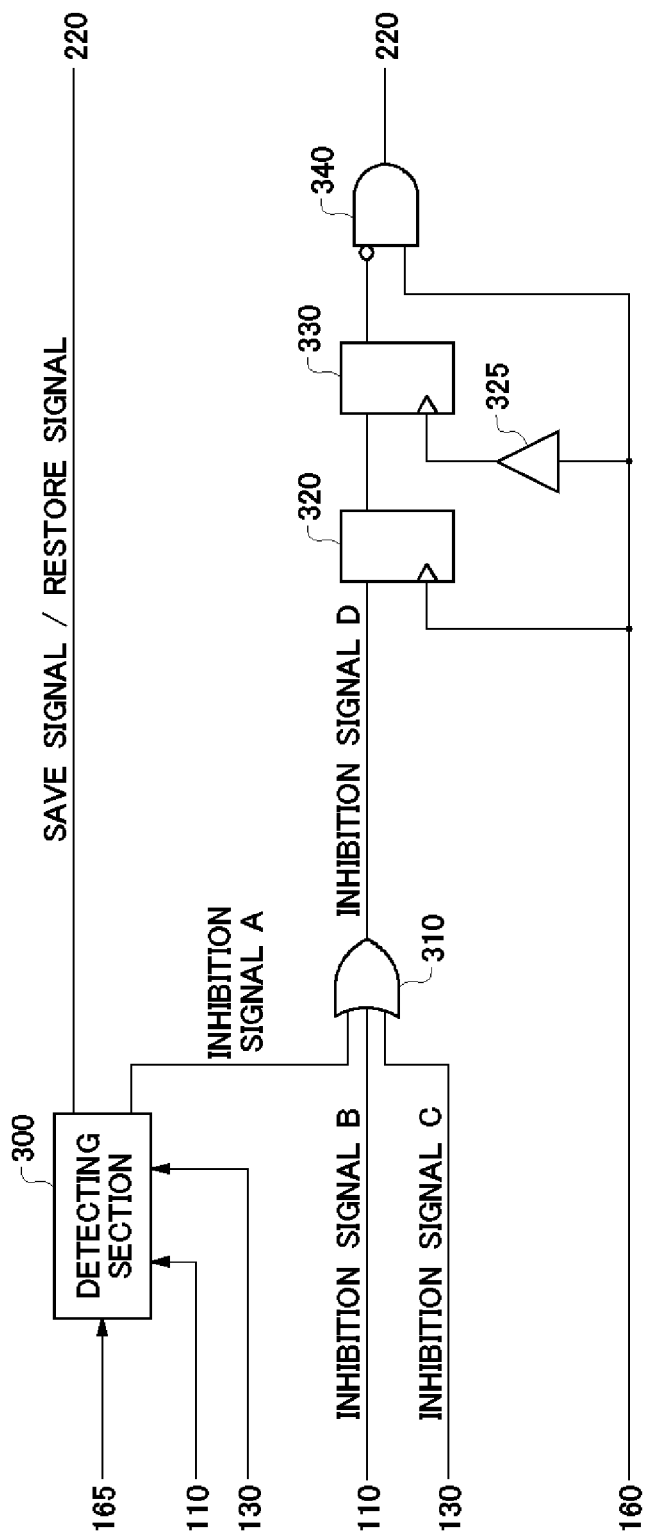
FIG. 3 shows a configuration of the phase adjustment control section 260 according to the present embodiment.

FIG. 3 shows a configuration of the phase adjustment control section 260 according to the present embodiment. The phase adjustment control section 260 includes a detecting section 300, an OR circuit 310, a flip-flop 320, a buffer 325, a flip-flop 330, and a logic circuit 340. The phase adjustment control section 260 controls whether the change in the phase shift amount of the phase shifting section 250 is allowed, based on control from the control apparatus 110, expected values or control from the pattern generating section 130, or measurement results concerning a change in the device signal from the detecting section 300.

The detecting section 300 receives via the DEMUX 165 the device signal acquired by the acquiring section 155, detects if the value of the device signal remains constant for at least a predetermined period, and outputs to the OR circuit 310 an inhibition signal A (a logic H signal in the present example) that inhibits change of the phase shift amount of the digital filter 220. As a result, the detecting section 300 inhibits the phase shift amount of the digital filter 220 from changing based on the phase comparison result. The detecting section 300 may include a run length measurement circuit that counts the number of cycles or bits for which the value of the device signal does not change or for which the device signal does not include a clock edge, and a judgment circuit that outputs a detection signal to the OR circuit 310 when the number of unchanging cycles or unchanging bits measured by the run length measurement circuit is greater than a predetermined value.

Instead, the detecting section 300 may output the inhibition signal A to the OR circuit 310 when the value of the device signal changes within a predetermined period or when the number of cycles in which the device signal includes a clock edge is less than or equal to a predetermined threshold value. As a result, the detecting section 300 can inhibit change of the phase shift amount according to whether the frequency of the clock pulse included in the device signal has dropped to a point where the phase-locked state cannot be maintained.

In response to detecting that the value of the device signal acquired by the acquiring section 155 has not changed, the detecting section 300 outputs to the digital filter 220 a save signal that instructs the phase shift amount used when the unchanging state of the device signal value was detected to be saved in the register 225. The detecting section 300 may detect a switch from a cycle in which the device signal changes and includes a clock edge to a cycle in which the device signal does not change and does not include a clock edge, and instruct the digital filter 220 to save the phase shift amount. Instead, the detecting section 300 may instruct the digital filter 220 to save the phase shift amount upon detecting that the value of the device signal has not changed within a period shorter than the period set as the condition for outputting the inhibition signal A. Furthermore, when the value of the device signal acquired by the acquiring section 155 does not change over a time greater than or equal to the predetermined period, the detecting section 300 outputs to the digital filter 220 a restore signal that instructs the phase shift amount saved in the register 225 to be again set in the digital filter 220 as the phase shift amount of the reference clock with respect to the device signal.

In the above description, the control apparatus 110 may be set prior to testing or during testing, based on setting from a user regarding at least one of a variety of parameters including (i) the threshold value for the number of cycles not containing a change or the threshold value for the number of cycles containing a change, (ii) the period used as a condition for the output of the inhibition signal A, and (iii) the period used as a condition for the output of the save signal. The pattern generating section 130 may set at least one of the above parameters based on designation of a test pattern or test instructions during test sequence execution.

The OR circuit 310 acquires the OR of the inhibition signal A from the detecting section 300, the inhibition signal B received from the control apparatus 110, and the inhibition signal C received from the pattern generating section 130, and outputs the result as an inhibition signal D. Here, the control apparatus 110 outputs the inhibition signal B, which is logic H, to inhibit change of the phase shift amount of the digital filter 220 in a period corresponding to designation from a user or a period between tests. The pattern generating section 130 outputs the inhibition signal C, which is logic H, to inhibit change of the phase shift amount of the digital filter 220 in a period during which change of the phase shift amount is inhibited by the test sequence. As a result, by providing explicit designation via the test instructions or test pattern, the user can inhibit change of the phase shift amount during a period in which the DUT 100 does not output the device signal with the clock superimposed thereon during testing, for example.

When change of the phase shift amount is inhibited by the detecting section 300, the control apparatus 110, or the pattern generating section 130 as a result of the OR circuit 310 outputting the inhibition signal D, which is the OR of the inhibition signal A, the inhibition signal B, and the inhibition signal C, change of the phase shift amount in the digital filter 220 based on the phase comparison result is inhibited.

Instead of or in addition to the above, the phase adjustment control section 260 may determine whether change of the phase shift amount of the digital filter 220 is inhibited based on an expected value generated by the pattern generating section 130. More specifically, when the expected value does not change over a time greater than or equal to the predetermined period, or when the expected value is irrelevant over a time greater than or equal to the predetermined period, i.e. when any value is allowed for the device signal, the phase adjustment control section 260 may detect this event in the same manner as the detecting section 300 and output an inhibition signal to the OR circuit 310.

The flip-flop 320, the buffer 325, the flip-flop 330, and the logic circuit 340 are provided to synchronize the inhibition signal D with the divided shift clock SFTCLKD and supply the inhibition signal D to the digital filter 220. The flip-flop 320 acquires the inhibition signal D at a timing of the divided shift clock SFTCLKD. The buffer 325 delays the divided shift clock SFTCLKD by a time sufficiently shorter than one cycle. The flip-flop 330 acquires the inhibition signal D acquired by the flip-flop 320, at a timing of the divided shift clock SFTCLKD delayed by the buffer 325. As a result, the flip-flop 320 and the flip-flop 330 can prevent incorrect operation due to a glitch when synchronizing the inhibition signal D, which changes when synchronized with the strobe signal STRB or the reference clock REFCLK in the test apparatus, with the divided shift clock SFTCLKD.

The logic circuit 340 acquires the AND of the divided shift clock SFTCLKD and the negation of the inhibition signal D, and supplies this AND to the digital filter 220. In this way, the logic circuit 340 passes the divided shift clock SFTCLKD when change of the phase shift amount is allowed and does not pass the divided shift clock SFTCLKD when change of the phase shift amount is inhibited. As a result, the phase adjustment control section 260 can inhibit change of the phase shift amount by stopping the clock operation of the digital filter 220.

With the test apparatus 10 described above, the phase shifting section 250 is inhibited from changing the phase shift amount of the digital filter 220 based on the phase comparison result of the phase comparing section 210, for at least a portion of a period during which the clock is not superimposed on the device output signal from the DUT 100. As a result, the test apparatus 10 prevents the gradual skew of the phase shift amount, which occurs during the period in which the clock is not superimposed, from causing an exit from the phase-locked state.

Figure 4:
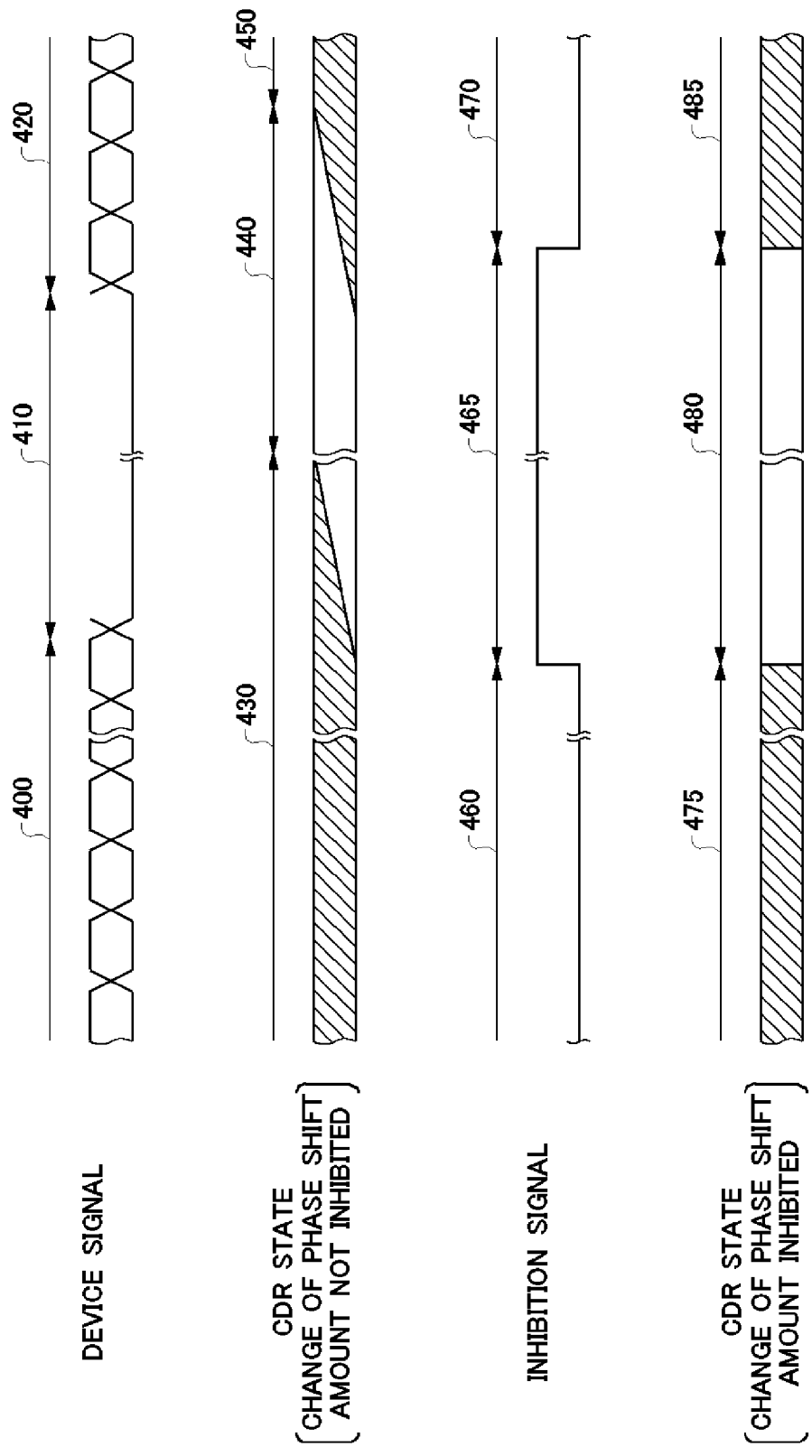
FIG. 4 shows exemplary operational timings of the test apparatus 10 according to the present embodiment.

FIG. 4 shows exemplary operational timings of the test apparatus 10 according to the present embodiment. In this example, the DUT 100 outputs, as the device signal, a data signal 400 with the clock superimposed thereon and followed, after the value thereof remains unchanged for a certain time, by a burst signal 410 without the clock superimposed thereon. After the burst signal 410, the DUT 100 returns to outputting the data signal 420 on which the clock is superimposed.

The phase comparing section 210 compares the phase of the strobe signal STRB and the phase of the recovered clock RCLK extracted from the data signal 400, and adjusts the phase of the shift clock SFTCLK based on the phase comparison result. As a result, the shift clock SFTCLK becomes phase-locked with respect to the device signal. This phase-locked state is shown by the hash marks in the CDR locked state 430 shown in FIG. 4.

When change of the phase shift amount is not inhibited by the phase adjustment control section 260, the digital filter 220 operates as shown by the CDR locked state 430, the CDR unlocked state 440, and the CDR locked state 450 in FIG. 4. When the DUT 100 outputs the burst signal 410, the clock recovering section 200 cannot extract the clock from the device signal, and the phase comparing section 210 cannot perform the phase comparison between the recovered clock RCLK and the strobe signal STRB. In this case, depending on the type of the phase comparing section 210, one of the early signal and the late signal continues to be output. An example of such a phase comparing section 210 is a phase-frequency comparator that includes a flip-flop that acquires logic H at an edge of the strobe signal STRB and outputs this result as the late signal, a flip-flop that acquires logic H at an edge of the strobe signal STRB and outputs this result as the early signal, and a circuit that resets both flip-flops to logic L when the output of both flip-flops is logic H.

When the phase comparing section 210 continues outputting one of the early signal and the late signal, if change of the phase shift amount is not inhibited, the phase shift amount of the digital filter 220 gradually shifts in one direction according to the phase comparison results, as shown in the CDR locked state 430 of FIG. 4, resulting in a gradual transition to the CDR unlocked state 440. After this, when the data signal 420 is output from the DUT 100, the phase comparing section 210 is again able to perform the phase comparison between the recovered clock RCLK and the strobe signal STRB. As a result, the operation state of the digital filter 220 gradually changes from a CDR unlocked state 440 in which the phase is not locked to a CDR locked state 430 in which the phase is locked.

In this way, when change of the phase shift amount by the phase adjustment control section 260 is inhibited, the phase shift amount changes in one direction while the DUT 100 outputs the burst signal 410 and is not in a phase-locked state for a certain period after the DUT 100 again outputs the data signal 420. Accordingly, the testing cannot be performed for a certain period after the DUT 100 begins outputting the data signal, thereby increasing the overall testing time.

Therefore, when change of the phase shift amount is inhibited, the following operation is performed. For example, the pattern generating section 130 may set the inhibition signal C to logic L while the DUT 100 outputs the data signal 400, so that the digital filter 220 enters the CDR operation mode 460. As a result, the pattern generating section 130 allows the digital filter 220 to maintain the phase-locked state by changing the phase shift amount to track the device signal, thereby achieving the CDR locked state 475. Next, at a timing when the DUT 100 has finished outputting the data signal 400 and begins outputting the burst signal 410, the pattern generating section 130 sets the inhibition signal C to logic H. Upon receiving this signal, the digital filter 220 transitions from the CDR operation mode 460 to the CDR stop mode 465, which results in a CDR function stop mode 480 in which the phase shift amount maintains the same value that it had immediately before the inhibition signal C was received. When the DUT 100 begins outputting the data signal 420, the pattern generating section 130 again sets the inhibition signal C to logic L so that the digital filter 220 enters the CDR locked state 485, and allows change of the phase shift amount being held.

As a result of the above operation, the digital filter 220 can maintain the phase shift amount of the immediately prior phase-locked state during the period when phase alignment cannot be achieved. Accordingly, when there is not a large phase skew between the clock of the test apparatus 10 and the clock of the DUT 100 while the DUT 100 outputs the burst signal 410, the test apparatus 10 can return to the phase-locked state when output of the data signal 420 begins or shortly after output of the data signal 420 begins.

The above describes an example in which the inhibition signal C switches at approximately the same timing that the device signal switches from the data signal to the burst signal. However, there may be cases where a significant amount of time is necessary between when the device signal switches from the data signal to the burst signal and when change of the phase shift amount is inhibited. For example, if it is detected that the value of the device signal acquired by the acquiring section 155 has not changed for a predetermined period or longer, the detecting section 300 may set the inhibition signal A to logic H. In this case, the burst signal 410 begins to be output after the data signal 400 in the device signal, after which the shift amount is changed for at least a designated period.

In such a case, the digital filter 220 may cancel the change in the phase shift amount that occurs during the predetermined period. For example, when the device signal switches from the data signal 400 to the burst signal 410, the digital filter 220 may receive a save signal from the detecting section 300 and save the phase shift amount in the digital filter 220 to the register 225. When the value of the device signal acquired by the acquiring section 155 does not change for a predetermined period or longer, the digital filter 220 receives a restore signal from the detecting section 300 and sets the phase shift amount of the reference clock with respect to the device signal to be the phase shift amount saved in the register 225.

Instead, when the value of the device signal does not change for the predetermined period or longer, the digital filter 220 may increase the phase shift amount, in a phase comparing section 210 in which the phase shift amount continues to decrease during this period, by an amount corresponding to the number of cycles in this period, and may decrease the phase shift amount, in a phase comparing section 210 in which the phase shift amount continues to increase during this period, by an amount corresponding to the number of cycles in this period. The magnitude of this increase or decrease of the phase shift amount is determined by the length of the designated period, and therefore the digital filter 220 may store this increase or decrease in advance as a constant value. As a result, the digital filter 220 can cancel the change in the phase shift amount that occurs during this period.

Figure 5:
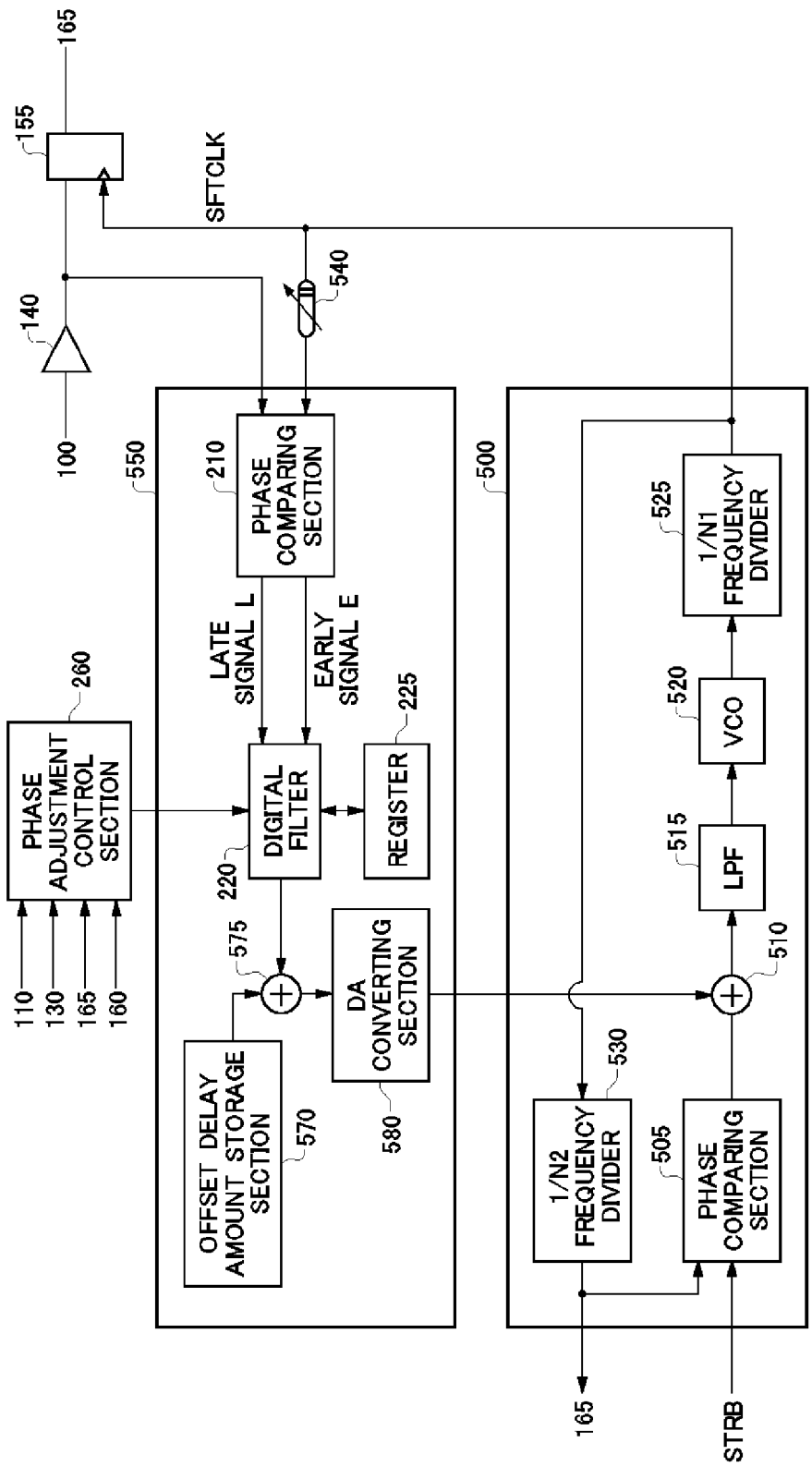
FIG. 5 shows a configuration of main components of the judging section 124 according to a first modification of the present embodiment.

FIG. 5 shows a configuration of main components of the judging section 124 according to a first modification of the present embodiment. The judging section 124 of the present modification adjusts the phase of the shift clock according to the clock superimposed on the device signal, using a different method than described in FIGS. 1 to 4. In FIG. 5, components that have the same function and configuration as components in FIGS. 1 to 4 are given the same reference numerals, and the following describes only differing points.

The judging section 124 of the present modification includes the comparator 140, a PLL (Phase Locked Loop) section 500, a variable delay circuit 540, a CDR circuit 550, the phase adjustment control section 260, and the acquiring section 155. The PLL section 500 outputs a shift clock SFT-CLK that is in synchronization with the strobe signal STRB and has a phase difference with respect to the strobe signal STRB equal to a delay amount input from the CDR circuit 550.

The PLL section 500 includes a phase comparing section 505, an adder 510, an LPF (Low-Pass Filter) 515, a VCO (Voltage-Controlled Oscillator) 520, a frequency divider 525, and a frequency divider 530. The phase comparing section 505 detects the phase difference between the strobe signal STRB and the clock output from the frequency divider 530 resulting from the shift clock SFTCLK being divided by the frequency of the strobe signal STRB, and outputs a phase difference signal indicating this phase difference. The adder 510 adds the delay amount received from the CDR circuit 550 to the phase difference signal from the phase comparing section 505. The LPF 515 limits or attenuates a high frequency component greater than or equal to a prescribed frequency in the phase signal to which the delay amount from the CDR circuit 550 was added, and passes a low frequency component that is less than the prescribed frequency.

The VCO 520 performs oscillation with a frequency according to the voltage of the phase difference signal passed by the LPF 515. The frequency divider 525 divides the oscillated clock to have a frequency corresponding to the clock superimposed on the device signal, resulting in a frequency of 1/N1 for example, and supplies the result to the acquiring section 155, the frequency divider 530, and the variable delay circuit 540. The frequency divider 530 divides the shift clock SFTCLK to have the frequency of the strobe signal STRB, resulting in a frequency of 1/N2 for example.

The variable delay circuit 540 delays the shift clock SFT-CLK by a time corresponding to approximately half the period of the device signal. The CDR circuit 550 controls the delay amount supplied to the adder 510 in the PLL section 500, such that the phase difference between the shift clock SFTCLK delay by the variable delay circuit 540 and the clock superimposed on the device signal decreases. As a result, the CDR circuit 550 adjusts the phase of the shift clock SFTCLK supplied to the acquiring section 155 to be approximately in the middle of the change points of the clock superimposed on the device signal.

The CDR circuit 550 includes the phase comparing section 210, the digital filter 220, the register 225, an offset delay amount storage section 570, an adder 575, and a DA converting section 580. The offset delay amount storage section 570 stores the offset delay amount set by the control apparatus 110 or the like. A user of the test apparatus 10 can change the phase of the shift clock SFTCLK with respect to the device signal, according to the testing content, by designating the offset delay amount.

The adder 575 calculates the delay amount by which the shift clock SFTCLK is to be delayed with respect to the strobe signal STRB, by adding the offset delay amount from the offset delay amount storage section 570 to the phase offset amount output by the digital filter 220. The DA converting section 580 converts the digital delay amount output by the adder 575 into an analog delay amount, and supplies the analog delay amount to the adder 510 in the PLL section 500.

The judging section 124 described above can acquire the device signal using a shift clock SFTCLK that is in synchronization with the strobe signal STRB and that has a prescribed phase difference with respect to the strobe signal STRB. Furthermore, the phase adjustment control section 260 can inhibit change of the phase shift amount by the digital filter 220 for at least a portion of a period in which the clock is not superimposed on the device signal.

Figure 6:
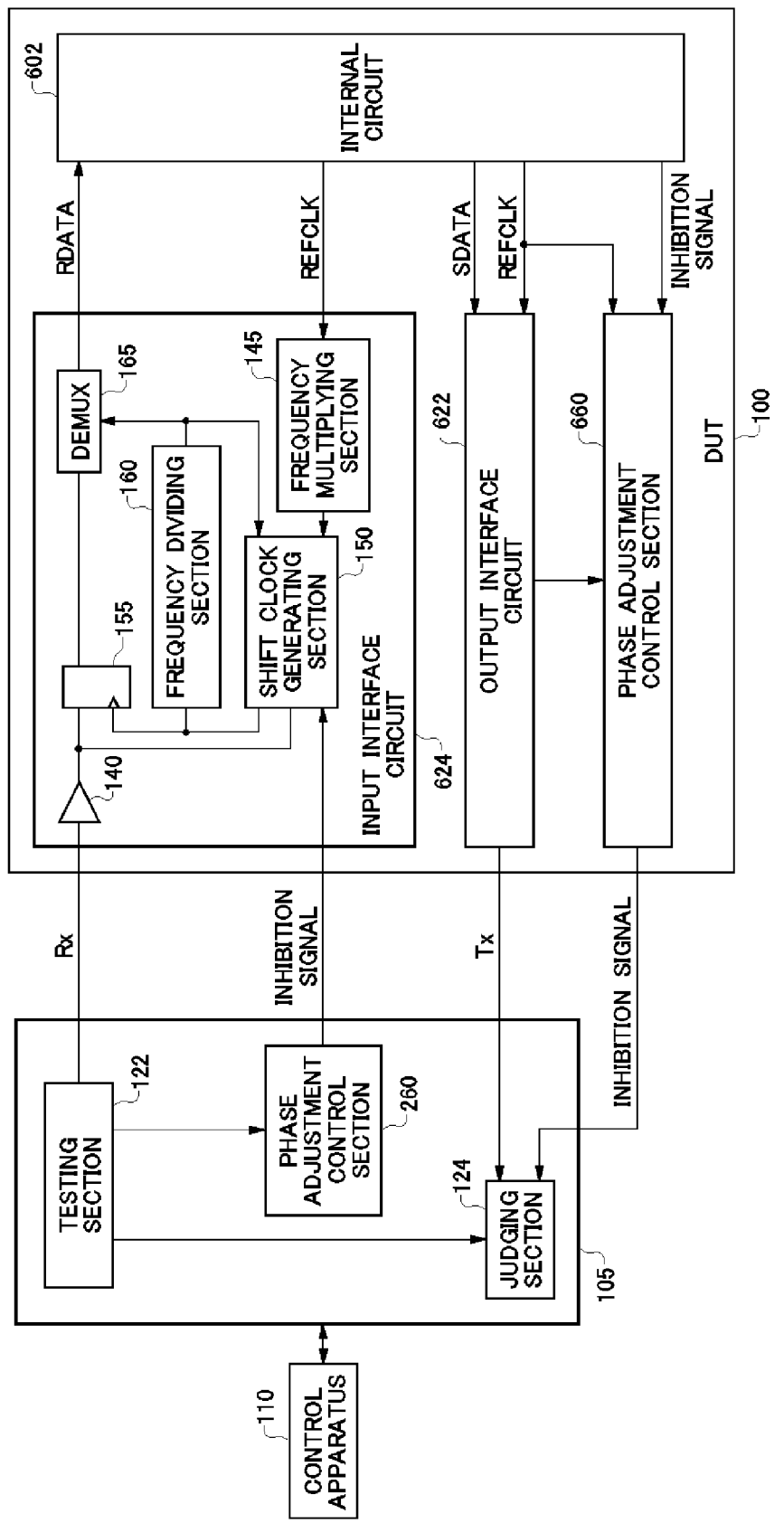
FIG. 6 shows a configuration of the test apparatus 10 according to a second modification of the present embodiment.

FIG. 6 shows a configuration of the test apparatus 10 according to a second modification of the present embodiment, along with the DUT 100. In FIG. 6, components that have the same function and configuration as components in FIGS. 1 to 5 are given the same reference numerals, and the following describes only differing points. In the present modification, the DUT 100 has a function to receive a signal with a clock superimposed thereon via an input terminal. By inhibiting phase adjustment in the DUT 100 for at least a portion of a period in which the clock is not superimposed on a test signal supplied to this input terminal of the DUT 100, the test apparatus 10 maintains the phase-locked state between the test apparatus 10 and the DUT 100.

The DUT 100 includes an internal circuit 602, an output IF (Interface) circuit 622, a phase adjustment control section 660, and an input IF circuit 624. The internal circuit 602 is designed according to the intended use of the DUT 100, operates according to an internal state of the internal circuit 602 and a reception signal from the outside received via the input IF circuit 624 or the like, and transmits a transmission signal to the outside via the output IF circuit 622 or the like as needed. The output IF circuit 622 is controlled by the internal circuit 602 and functions as a transmission apparatus. The output IF circuit 622 receives transmission data SDATA and a reference clock REFCLK within the DUT 100, and transmits the transmission data SDATA and the reference clock REFCLK to the outside as a transmission signal. In the present embodiment, the output IF circuit 622 transmits a transmission signal obtained by serializing the transmission data SDATA and superimposing thereon the reference clock REFCLK or the multiplied reference clock REFCLKM obtained as an integer multiple of the reference clock REFCLK.

The phase adjustment control section 660 operates based on the reference clock REFCLK in the DUT 100. The phase adjustment control section 660 transmits an inhibition signal that instructs the phase adjustment control section 260 in the judging section 124 of the test apparatus body 105 to inhibit change of the phase shift amount based on the phase comparison result from the phase comparing section 210, for at least a position of the period during which the multiplied reference clock REFCLKM is not superimposed on the transmission signal transmitted by the output IF circuit 622. The phase adjustment control section 660 includes the detecting section 300 and the OR circuit 310 shown in FIG. 3, and transmits the inhibition signal to the judging section 124 in the test apparatus body 105, in the same manner as the phase adjustment control section 260 shown in FIG. 3.

When the data signal is not being transmitted, the phase adjustment control section 660 may transmit the inhibition signal received from the internal circuit 602 to the judging section 124 in the test apparatus body 105. When the value of the transmission data SDATA or the transmission signal has remained the same for a predetermined period or longer, the phase adjustment control section 660 may transmit the inhibition signal to the judging section 124 in the test apparatus body 105.

The input IF circuit 624 is controlled by the internal circuit 602 and functions as a receiving apparatus. The input IF circuit 624 receives the reference clock REFCLK in the DUT 100 from the internal circuit 602 and also receives a reception signal input from the outside via the input terminal, and supplies reception data RDATA to the internal circuit 602. The input IF circuit 624 includes the comparator 140, the frequency multiplying section 145, the shift clock generating section 150, the acquiring section 155, the frequency dividing section 160, and the DEMUX 165. The functions and operations of these components are the same as the components in FIGS. 1 to 4 having the same reference numerals, and the following describes only differing points.

The main difference between the shift clock generating section 150 in the input IF circuit 624 and the shift clock generating section 150 in FIG. 2 is that the shift clock generating section 150 in the input IF circuit 624 uses, as the internal clock for acquiring the reception signal, a clock obtained as the result of the @145 multiplying the reference clock REFCLK in the @100. The clock recovering section 200 in the shift clock generating section 150 recovers the clock that is superimposed on the reception signal input from the outside via the input terminal. The phase comparing section 210 in the shift clock generating section 150 makes a phase comparison between the multiplied clock REFCLKM obtained as an integer multiple of the reference clock REFCLK of the DUT 100 and a recovered clock obtained by extracting the clock superimposed on the reception signal. The digital filter 220, register 225, jitter injecting section 230, and phase shifting section 250 in the shift clock generating section 150 adjust the phase shift amount of the multiplied clock REFCLKM with respect to the reception signal, based on the phase comparison results. Here, the input IF circuit 624 just needs to fulfill the function of a receiving apparatus, and need not generate the shift clock SFTCLK using the strobe signal STRB generated by the timing generating section 125, as the judging section 124 shown in FIG. 1 does.

The shift clock generating section 150 need not include the jitter injecting section 230 and the adder 240. The DUT 100 may house the clock conversion circuit components of the phase adjustment control section 260 shown in FIG. 3, including the flip-flop 320, the buffer 325, the flip-flop 330, and the logic circuit 340, in the shift clock generating section 150, and may receive the save signal, the restore signal, and the inhibition signal D from the outside. Instead, the shift clock generating section 150 in the input IF circuit 624 may house the OR circuit 310 and the detecting section 300 of the phase adjustment control section 260 shown in FIG. 3, and may inhibit change of the phase shift amount based on the phase comparison result, for at least a portion of the period during which the clock is not superimposed on the reception signal.

The acquiring section 155 acquires the reception signal according to a shift clock SFTCLK, which is a reference clock having an adjusted phase shift amount with respect to the reception signal. The DEMUX 165 demultiplexes the reception signal acquired by the acquiring section 155, and supplies the result to the internal circuit 602 as the reception data RDATA.

The test apparatus 10 includes the control apparatus 110 and the test apparatus body 105. The test apparatus body 105 includes the testing section 122, the judging section 124, and the phase adjustment control section 260. The testing section 122 is the same as the testing section 122 in FIG. 1, and functions as a test signal supplying section that supplies the input terminal of the DUT 100 with a test signal for testing the DUT 100. In the present embodiment, the testing section 122 supplies the input terminal of the DUT 100 with a test signal obtained by superimposing a clock on a data signal. The judging section 124 has the same function and configuration as the judging section 124 of FIG. 1.

The phase adjustment control section 260 supplies the DUT 100 with the inhibition signal that inhibits change of the phase shift amount based on the phase comparison results, for at least a position of the period during which the clock is not superimposed on the test signal. The phase adjustment control section 260 includes the detecting section 300 and the OR circuit 310 shown in FIG. 3. The phase adjustment control section 260 may supply the inhibition signal to the DUT 100 according to the inhibition signal B from the control apparatus 110, in the same manner as the phase adjustment control section 260 shown in FIGS. 1 to 5. The phase adjustment control section 260 may supply the DUT 100 with the inhibition signal C during a period in which change of the shift amount is inhibited by the test sequence performed by the testing section 122. The phase adjustment control section 260 may receive the test signal, detect when the value of the test signal remains the same for a predetermined period or longer, and supply the DUT 100 with the inhibition signal A based on this detection.

The test apparatus 10 described above can prevent the DUT 100 from leaving the phase-locked state by inhibiting change of the phase shift amount in the DUT 100 for at least a portion of the period during which the clock is not superimposed on the test signal. Furthermore, by connecting a plurality of the DUTs 100 shown above to each other, change of the phase shift amount in each connected DUT 100 can be prevented, for at least a portion of the period during which the clock is not superimposed on the transmission signal, thereby preventing the connected DUTs 100 from leaving the phase-locked state.

The test apparatus 10 may supply the DUT 100 with the inhibition signal and the test signal via separate input terminals of the DUT 100, or may supply both signals to the same input terminal of the DUT 100. In this case, before setting a burst state during which the value of the test signal cannot change, the test apparatus 10 may supply the DUT 100 with a test signal that includes an inhibition command inhibiting change of the phase shift amount. If the received test signal includes an inhibition command pattern, the DUT 100 transitions to the CDR stop mode to inhibit change of the phase shift amount.

Figure 7:
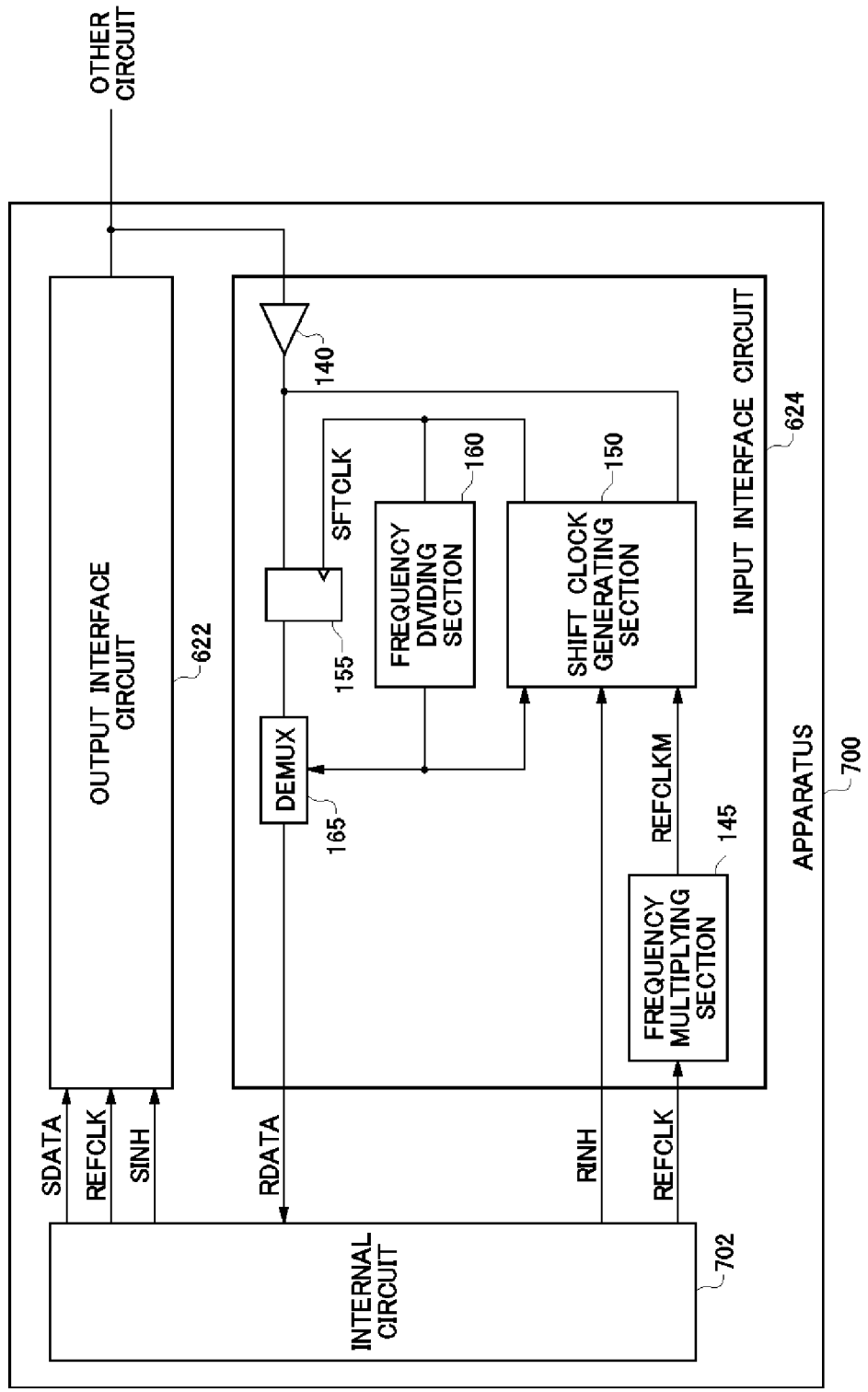
FIG. 7 shows a configuration of an apparatus 700 according to a third modification of the present embodiment.

FIG. 7 shows a configuration of an apparatus 700 according to a third modification of the present embodiment. In FIG. 7, components that have the same function and configuration as components in FIGS. 1 to 6 are given the same reference numerals, and the following describes only differing points. The apparatus 700 is connected to another apparatus 700 or to an apparatus that has the same communication interface, and sends and receives data to and from the connected apparatus at different times, via a bidirectional communication path.

The apparatus 700 includes an internal circuit 702, the output IF circuit 622, and the input IF circuit 624. The internal circuit 702 is designed according to the intended use of the apparatus 700, operates according to an internal state of the internal circuit 702 and a reception signal from the outside received via the input IF circuit 624 or the like, and transmits a transmission signal to the outside via the output IF circuit 622 or the like as needed. The internal circuit 702 supplies the output IF circuit 622 with the reference clock REFCLK, the transmission data SDATA, and a transmission inhibition signal SINH that inhibits transmission by the output IF circuit 622 in a period during which the reception signal is received from the external apparatus. The internal circuit 702 supplies the input IF circuit 624 with a reception inhibition signal RINH for inhibiting change of the phase shift amount based on the phase comparison results, in a period during which the reference clock REFCLK and the transmission signal transmitted to the external apparatus are being transmitted to the input IF circuit 624.

The output IF circuit 622 functions as a transmitting section that transmits the transmission signal to the outside via a terminal, in a period during which the reception signal is not received from this terminal connected to the bidirectional communication path. When there is no data to be transmitted or when the reception signal is being received from the external apparatus, the output IF circuit 622 receives the transmission inhibition signal SINH from the internal circuit 702 and stops outputting signals to the communication path.

The input IF circuit 624 functions as a receiving section that receives the reception signal from the outside via a terminal, in a period during which the transmission signal is not transmitted from this terminal connected to the bidirectional communication path. When there is no data to be received or when the transmission signal is being transmitted to the external apparatus, the input IF circuit 624 receives the reception inhibition signal RINH from the internal circuit 702. Upon receiving the reception inhibition signal RINH, the input IF circuit 624 uses this reception inhibition signal RINH as an inhibition signal that inhibits change of the phase shift amount in the input IF circuit 624.

With the apparatus 700 described above, when performing time-divided communication with an external apparatus via a bidirectional communication path, the apparatus 700 can inhibit change of the shift amount in the input IF circuit 624 during a period in which the output IF circuit 622 is transmitting the transmission signal. Accordingly, during transmission by the output IF circuit 622, the phase shift amount can be prevented from being adjusted by the transmission signal of the output IF circuit 622. The apparatus 700 may determine which of the apparatus 700 itself or the apparatus connected thereto transmits signals, via the communication path described above or another communication path.

Figure 8:
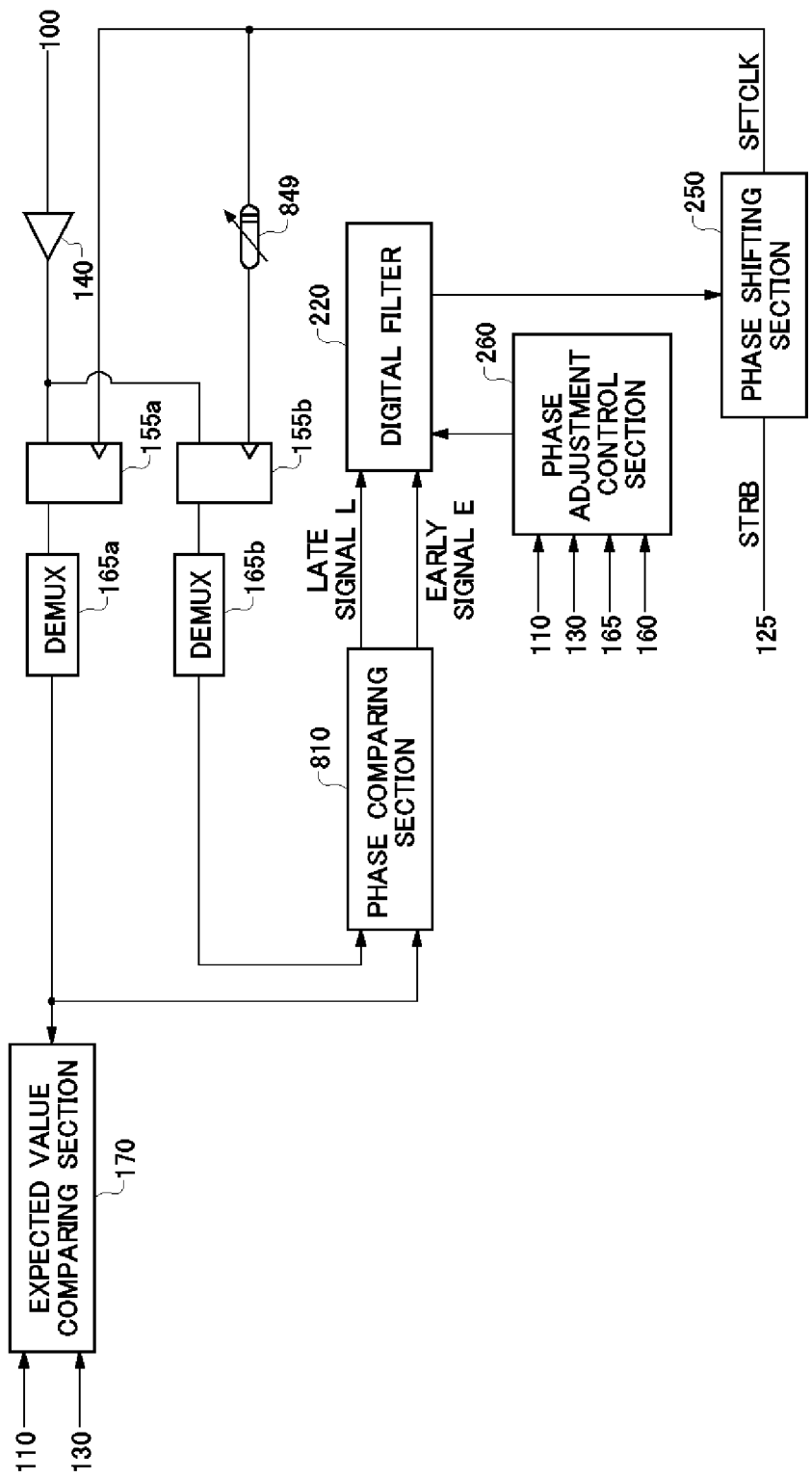
FIG. 8 shows a configuration of the judging section 124 according to a fourth modification of the present embodiment.

FIG. 8 shows a configuration of the judging section 124 according to a fourth modification of the present embodiment. In FIG. 8, components that have the same function and configuration as components in FIGS. 1 and 2 are given the same reference numerals, and the following describes only differing points. (Comment: FIG. 8 describes a modification of the judging section 124 of FIG. 1. The phase shift amount is adjusted based on the results of acquiring the device signal at a timing of the shift clock SFTCLK and a timing delayed by half a cycle of the shift clock SFTCLK.)

A variable delay circuit 849 delays the shift clock SFTCLK to create a clock having a different phase than the original shift clock SFTCLK. For example, the variable delay circuit 849 may delay the shift clock SFTCLK by less than one cycle, preferably less than a half cycle, and supply the resulting clock to an acquiring section 155b.

An acquiring section 155a acquires the device signal received via the comparator 140, according to the shift clock SFTCLK. The acquiring section 155b acquires the device signal received via the comparator 140, according to the shift clock SFTCLK delayed by the variable delay circuit 849. A DEMUX 165a demultiplexes the device signal acquired by the acquiring section 155a, and supplies the result to the expected value comparing section 170 and a phase comparing section 810. A DEMUX 165b demultiplexes the device signal acquired by the acquiring section 155b, and supplies the result to the phase comparing section 810.

The phase comparing section 810 compares the phase of the shift clock SFTCLK and the phase of the clock superimposed on the device signal, based on the device signal demultiplexed by the DEMUX 165a and the device signal demultiplexed by the DEMUX 165b.

Figure 9:
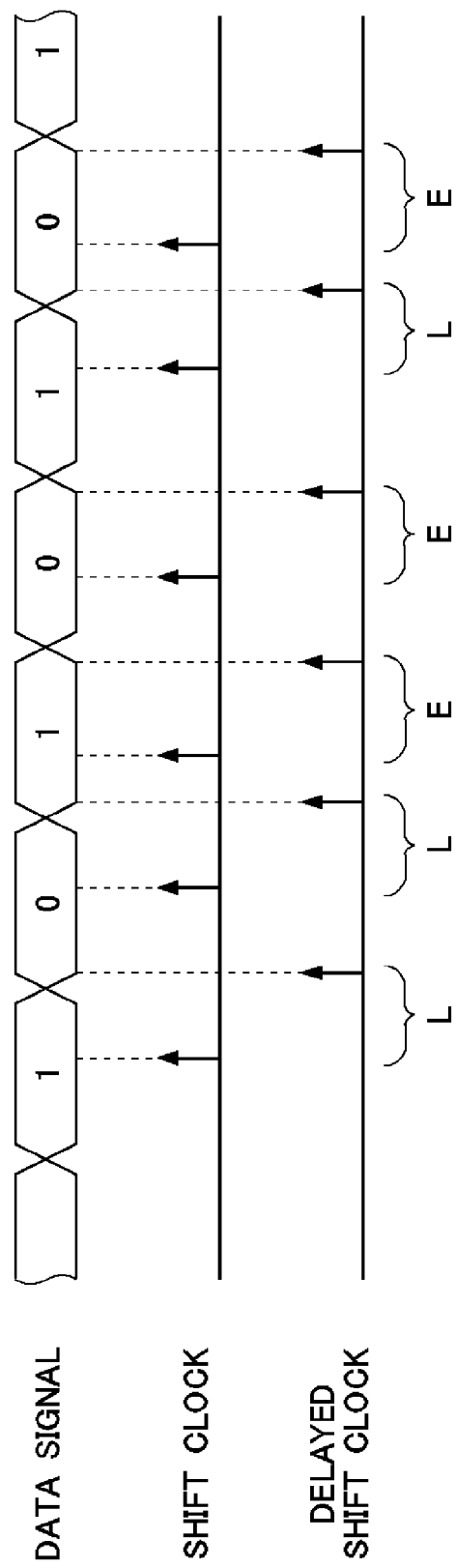
FIG. 9 schematically shows the operation of the phase comparing section 810 according to the fourth embodiment of the present invention.

FIG. 9 schematically shows the operation of the phase comparing section 810 according to the fourth embodiment of the present invention. In the present modification, the variable delay circuit 849 delays the shift clock SFTCLK by substantially half a cycle. The phase comparing section 810 adjusts the phase shift amount of the phase shifting section 250 such that the phase of the shift clock SFTCLK delayed by the variable delay circuit 849 approaches the phase of the change point of the data signal. As a result, the phase comparing section 810 phase of the shift clock SFTCLK can approach the approximate center of each cycle of the data signal.

If the device signal at the timing of the shift clock SFTCLK acquired by the acquiring section 155a differs from the device signal at the timing of the delayed shift clock SFTCLK acquired by the acquiring section 155b, the phase comparing section 810 judges that the delayed shift clock SFTCLK is positioned in the next cycle of the shift clock SFTCLK. In this case, the phase comparing section 810 outputs a late signal L indicating that the shift clock SFTCLK is late.

On the other hand, if the device signal at the timing of the shift clock SFTCLK acquired by the acquiring section 155a is the same as the device signal at the timing of the delayed shift clock SFTCLK acquired by the acquiring section 155b, the phase comparing section 810 judges that the delayed shift clock SFTCLK is positioned in this cycle of the shift clock SFTCLK. In this case, the phase comparing section 810 outputs an early signal E indicating that the shift clock SFTCLK is early.

The phase comparing section 810 performs the above process using the device signals demultiplexed by the DEMUX 165a and the DEMUX 165b. As a result, the phase comparing section 810 can perform a phase comparison at a lower frequency than the phase comparison with the original data signal. The judging section 124 described in FIGS. 8 and 9 can be used instead of the input IF circuit 624 shown in FIGS. 6 and 7, and the judging section 124 can be applied to a modified circuit in the same manner as the input IF circuit 624 shown in FIGS. 6 and 7.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. In particular, in a method and an apparatus that are realized using hardware such as circuits, each component of a circuit can operate if the necessary data or signals are received, and therefore can process the data or signals in any order, not just the order in which the data or signals are received. Even if the process flow is described using phrases such as "first" or "next" in the claims, embodiments, or diagrams, it does not necessarily mean that the process must be performed in this order.

In the embodiments described above, in order to acquire the reception signal or the device signal according to the multiplied reference clock REFCLKM or the strobe signal STRB having a phase shift amount with respect to the device signal, the acquiring section 155 acquires the reception signal or the device signal based on the shift clock SFTCLK obtained by the phase shifting section 250 phase-shifting the multiplied reference clock REFCLKM or the strobe signal. Instead, the acquiring section 155 may adjust the phase shift amounts of the multiplied reference clock REFCLKM or the strobe signal STRB with respect to the reception signal or the device signal by delaying the reception signal or the device signal. Furthermore, the acquiring section 155 may adjust the phase shift amount between the device signal and the multiplied reference clock REFCLKM or the strobe signal STRB by delaying both (i) the device signal and (ii) the reference clock REFCLKM or the strobe signal STRB by different amounts.

When change of the phase shift amount is inhibited, the phase adjustment control section 260 may mask the late signal L and early signal E output by the phase comparing section 210 or the phase comparing section 810 with logic L, for example, and supply the digital filter 220 with phase comparison results indicating that there is no delay or advancement. The signal on which the clock is superimposed may be a differential signal having a positive signal and a negative signal. The acquiring section 155 may include a plurality of sets of acquiring sections 155a and 155b and adopt a configuration for acquiring the signals from the comparator 140 in an interleaved manner.

What is claimed is:

1. A test apparatus that tests a device under test, comprising:
   a phase comparing section that compares a phase of an internal clock generated in the test apparatus and a phase of an embedded clock superimposed on a device signal output pill by the device under test;
   an adjusting section that adjusts a phase shift amount of the internal clock with respect to the device signal output by the device under test, based on the phase comparison result;
   an acquiring section that acquires the device signal output by the device under test according to the internal clock whose phase shift amount with respect to the device signal output by the device under test is adjusted; and
   an inhibiting section that detects whether there exists a period during which the embedded clock is not superimposed on the device signal acquired by the acquiring section and inhibits change of the phase shift amount based on the phase comparison result, for at least a portion of the period during which the embedded clock is not superimposed on the device signal acquired by the acquiring section.

2. The test apparatus according to claim 1, wherein
   the phase comparing section outputs, as the phase comparison result, a late signal indicating that an edge of the internal clock is later than an edge of the embedded clock superimposed on the device signal output by the device under test or an early signal indicating that the edge of the internal clock is earlier than the edge of the embedded clock superimposed on the device signal output by the device under test.

3. The test apparatus according to claim 2, wherein
on a condition that change of the phase shift amount is not inhibited by the inhibiting section, the adjusting section decreases the phase shift amount therein when the late signal is received as the phase comparison result and increases the phase shift amount therein when the early signal is received as the phase comparison result, and
on a condition that change of the phase shift amount is inhibited by the inhibiting section, the adjusting section does not change the phase shift amount therein.

4. The test apparatus according to claim 1, further comprising a testing section that executes a test sequence for testing the device under test, wherein
the inhibiting section inhibits change of the phase shift amount by the adjusting section, during a period in which change of the phase shift amount is inhibited by the test sequence.

5. The test apparatus according to claim 1, further comprising an expected value comparing section that compares a value of the device signal output by the device under test and acquired by the acquiring section to an expected value, wherein
the inhibiting section judges whether to inhibit change of the phase shift amount by the adjusting section, based on the expected value.

6. The test apparatus according to claim 1, wherein
when a value of the device signal output by the device under test and acquired by the acquiring section remains unchanged for a predetermined period or longer, the inhibiting section inhibits change of the phase shift amount based on the phase comparison result.

7. The test apparatus according to claim 1, wherein
when a value of the device signal output by the device under test and acquired by the acquiring section remains unchanged for a predetermined period or longer, the adjusting section cancels change in the phase shift amount that occurred during the predetermined period.

8. The test apparatus according to claim 1, wherein
in response to detection that a value of the device signal output by the device wider test and acquired by the acquiring section has not changed, the adjusting section saves, in a register, the phase shift amount that was adjusted up to a timing of the detection that the value of the device signal has not changed, and
in response to detection that the value of the device signal output by the device under test and acquired by the acquiring section has not changed for a predetermined period or longer, the adjusting section sets the phase shill amount of the internal clock with respect to the device signal output by the device under test to be the phase shift amount saved in the register.

9. The test apparatus according to claim 1, wherein
the inhibiting section includes an OR circuit that outputs a signal acquired by a logical addition of (i) a first inhibition signal to inhibit change of the phase shift amount based on the phase comparison result, (ii) a second inhabitation signal to inhibit change of the phase shift amount in a period corresponding to designation from a user or a period between tests, and (iii) a third inhabitation signal to inhibit change of the phase shift amount in a period during which change of the phase shift amount is inhibited by a test sequence, and
the inhibiting section inhibits the change of the phase shift amount in accordance with the signal output by the OR circuit.

10. The test apparatus according to claim 9, further comprising:
a control apparatus to control testing of the device tinder test; and
a pattern generator to generate a test pattern, wherein
the inhibiting section includes a detection section that outputs the first inhibition signal if the detection section detects that the value of the device signal output by the device under test and acquired by the acquiring section remains constant for a predetermined period,
the control apparatus outputs the second inhibition signal, and
the pattern venerator outputs the third inhibition signal.

11. The test apparatus according to claim 1, wherein
the inhibiting section includes:
a run length measurement circuit that counts the number of cycles or bits for which the value of the device signal output by the device under test and acquired by the acquiring section does not change or for which the device signal output by the device under test and acquired by the acquiring section does not include a clock edge; and
a judgment circuit that outputs a signal to inhibit the change of the phase shift amount when the counted number of cycles or the counted number of bits is greater than a predetermined value.

12. The test apparatus according to claim 1, wherein the inhibiting section outputs a signal to inhibit the change of the phase shift amount when the number of cycles for which the device signal output by the device under test and acquired by the acquiring, section includes a clock edge is less than or equal to a predetermined threshold value.

13. A test apparatus that tests a device under test, wherein
the device under test includes:
a phase comparing section that compares a phase of an internal clock of the device under test and a phase of an embedded clock superimposed on a reception signal input via an input terminal;
an adjusting section that adjusts a phase shill amount of the internal clock with respect to the reception signal input via the input terminal, based on the phase comparison result; and
an acquiring section that acquires the reception signal input via the input terminal according to the internal clock whose phase shift amount with respect to the reception signal input via the input terminal is adjusted, and
the test apparatus comprises:
a test signal supplying section that supplies a test signal for testing the device under test to the input terminal of the device under test; and
an inhibiting section that detects whether there exists a period during which an embedded clock is not superimposed on the test signal and supplies the device under test with an inhibition signal inhibiting change of the phase shift amount based on the phase comparison result, for at least a portion of the period during which the embedded clock is not superimposed on the test signal.

14. A receiving apparatus comprising:
a phase comparing section that compares a phase of a reference clock to a phase of art embedded clock superimposed on a reception signal from the outside;
an adjusting section that adjusts a phase shift amount of the reference clock with respect to the reception signal from the outside, based on the phase comparison result;

an acquiring section that acquires the reception signal from the outside according to the reference clock whose phase shift amount with respect to the reception signal from the outside is adjusted; and an inhibiting section that detects whether there exists a period during which the embedded clock is not superimposed on the reception signal acquired by the acquiring section and inhibits change of the phase shift amount based on the phase comparison result, for at least a portion of the period during which the embedded clock is not superimposed on the reception signal acquired by the acquiring section.

15. The receiving apparatus according to claim 14, further comprising a transmitting section that transmits a transmission signal to the outside via a terminal used to receive the reception signal from the outside, during a period in which the reception signal from the outside is not input to the terminal, wherein the inhibiting section inhibits change of the phase shift amount based on the phase comparison result, during a period in which the transmitting section transmits the transmission signal to the outside via the terminal.

16. A transmission apparatus that transmits a signal to a receiving apparatus, wherein
the receiving apparatus includes:
a phase comparing section that compares a phase of a reference clock of the receiving apparatus and a phase of an embedded clock superimposed on a reception signal input via an input terminal;
an adjusting section that adjusts a phase shift amount of the reference clock with respect to the reception signal input via the input terminal, based on the phase comparison result; and
an acquiring section that acquires the reception signal input via the input terminal according to the reference clock whose phase shift amount with respect to the reception signal is adjusted, and
the transmission apparatus comprises:
a transmitting section that supplies, to the input terminal of the receiving apparatus, a transmission signal to be transmitted to the receiving apparatus; and
an inhibiting section that detects whether there exists a period during which an embedded clock is not superimposed on the transmission signal and inhibits change of the phase shift amount based on the phase comparison result, for at least a portion of the period during which the embedded clock is not superimposed on the transmission signal.

17. A test method for testing a device wider test, comprising:
comparing a phase of an internal clock of the test apparatus and a phase of an embedded clock superimposed on a device signal output by the device under test;
adjusting a phase shift amount of the internal clock, with respect to the device signal output by the device under test, based on the phase comparison result;
acquiring the device signal output by the device under test according to the internal clock whose phase shift amount with respect to the device signal output by the device under test is adjusted;
detecting whether there exists a period during which the embedded clock is not superimposed on the device signal acquired by the acquiring section; and
inhibiting change of the phase shift amount based on the phase comparison result, for at least a portion of period during which the embedded clock is not superimposed on the device signal acquired by the acquiring section.

18. A test method for testing a device under test, wherein the device under test includes:
a phase comparing section that compares a phase of an internal clock of the device under test and a phase of an embedded clock superimposed on a reception signal input via an input terminal;
an adjusting section that adjusts a phase shift amount of the internal clock with respect to the reception signal input via the input terminal, based on the phase comparison result; and
an acquiring section that acquires the reception signal input via the input terminal according to the internal clock whose phase shift amount with respect to the reception signal input via the input terminal is adjusted, and
the test method comprises:
supplying a test signal for testing the device under test to the input terminal of the device under test;
detecting whether there exists a period during which an embedded clock is not superimposed on the test signal; and
supplying the device under test with an inhibition signal inhibiting change of the phase shift amount based on the phase comparison result, for at least as portion of the period during which the embedded clock is not superimposed on the test signal.

19. A receiving method comprising:
comparing a phase of a reference clock to a phase of an embedded clock superimposed on a reception signal from the outside;
adjusting a phase shift amount of the reference clock with respect to the reception signal from the outside, based on the phase comparison result;
acquiring the reception signal from the outside according to the reference clock whose phase shift amount with respect to the reception signal from the outside is adjusted;
detecting whether there exists a period during which the embedded clock is not superimposed on the reception signal acquired by the acquiring section; and
inhibiting change of the phase shift amount based on the phase comparison result, for at least a portion of the period during which the embedded clock is not superimposed on the reception signal acquired by the acquiring section.

20. A transmission method for transmitting a signal to a receiving, apparatus, wherein
the receiving apparatus includes:
a phase comparing section that compares a phase of a reference clock of the receiving apparatus and a phase of an embedded clock superimposed on a reception signal input via an input terminal;
an adjusting section that adjusts a phase shift amount of the reference clock with respect to the reception signal input via the input terminal, based on the phase comparison result; and
an acquiring section that acquires the reception signal input via the input terminal according to the reference clock whose phase shift amount with respect to the reception signal input via the input terminal is adjusted, and
the transmission method comprises:
supplying, to the input terminal of the receiving apparatus, a transmission signal to be transmitted to the receiving apparatus;
detecting whether there exists a period during which an embedded clock is not superimposed on the transmission signal; and inhibiting change of the phase shift amount based on the phase comparison result, for at least a portion of the period during which the embedded clock is not superimposed on the transmission signal.

\* \* \* \* \*